(12) United States Patent
Imamura

(10) Patent No.: US 11,024,510 B2
(45) Date of Patent: Jun. 1, 2021

(54) PATTERN FORMING METHOD AND METHOD OF MANUFACTURING SEMICONDUCTOR DEVICE

(71) Applicant: KIOXIA CORPORATION, Tokyo (JP)

(72) Inventor: Tsubasa Imamura, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/801,879

(22) Filed: Feb. 26, 2020

(65) Prior Publication Data

US 2021/0090893 A1    Mar. 25, 2021

(30) Foreign Application Priority Data

Sep. 20, 2019    (JP) .............................. JP2019-170980

(51) Int. Cl.
*H01L 21/308*    (2006.01)
*H01L 21/033*    (2006.01)

(52) U.S. Cl.
CPC ...... *H01L 21/3086* (2013.01); *H01L 21/0337* (2013.01); *H01L 21/0338* (2013.01)

(58) Field of Classification Search
None
See application file for complete search history.

(56) References Cited

U.S. PATENT DOCUMENTS 9,006,111 B2    4/2015 Chiba et al.

FOREIGN PATENT DOCUMENTS

JP    2009194170 A    8/2009
JP    6056294 B2    1/2017

*Primary Examiner* — Roberts P Culbert
(74) *Attorney, Agent, or Firm* — Kim & Stewart LLP

(57) ABSTRACT

According to one embodiment, a pattern forming method includes forming an organic layer on a first layer. The organic layer has a first region having a first thickness and a first width, a second region having a second thickness and a second width, and a third region located between the first region and the second region. The third region has a third thickness less than each of the first thickness and the second thickness and a third width. A second layer containing silicon oxide is then formed on a surface of the organic layer in a process chamber of a reactive ion etching device. The third region is then etched in the process chamber using the second layer as a mask.

20 Claims, 18 Drawing Sheets

PATTERN FORMING METHOD AND METHOD OF MANUFACTURING SEMICONDUCTOR DEVICE

CROSS-REFERENCE TO RELATED APPLICATION

This application is based upon and claims the benefit of priority from Japanese Patent Application No. 2019-170980, filed Sep. 20, 2019, the entire contents of which are incorporated herein by reference.

FIELD

Embodiments described herein relate generally to a pattern forming method and a method of manufacturing a semiconductor device.

BACKGROUND

It is often required to form a fine pattern on a semiconductor substrate in order to achieve high integration in a semiconductor device. One method of forming the fine pattern on a semiconductor substrate is a nano-imprinting method.

In the nano-imprinting method, a template (also sometimes referred to as a mold or imprint mold) having a fine pattern therein or thereon is brought into contact with a resist material applied to a surface of a layer to be processed/patterned. By such imprinting/molding, a finely patterned resist layer can be formed. The fine pattern can then be transferred into the underlying layer by etching using the patterned resist layer as an etch mask or the like.

With nano-imprinting methods, a thin, residual resist layer generally remains in the recessed regions of the imprinted pattern. It is generally required to remove this thin resist layer by etching. Problems may arise in that such removal of the residual resist layer can result in a thickness loss in the projecting/protruding regions of the imprinted resist pattern, and as the residual resist layer is reduced/removed, a dimension of the imprinted pattern may be changed by the removal process. Particularly, such a problem becomes more important when the pattern being imprinted is finer (e.g., narrower feature dimensions).

DETAILED DESCRIPTION

Figure 1:
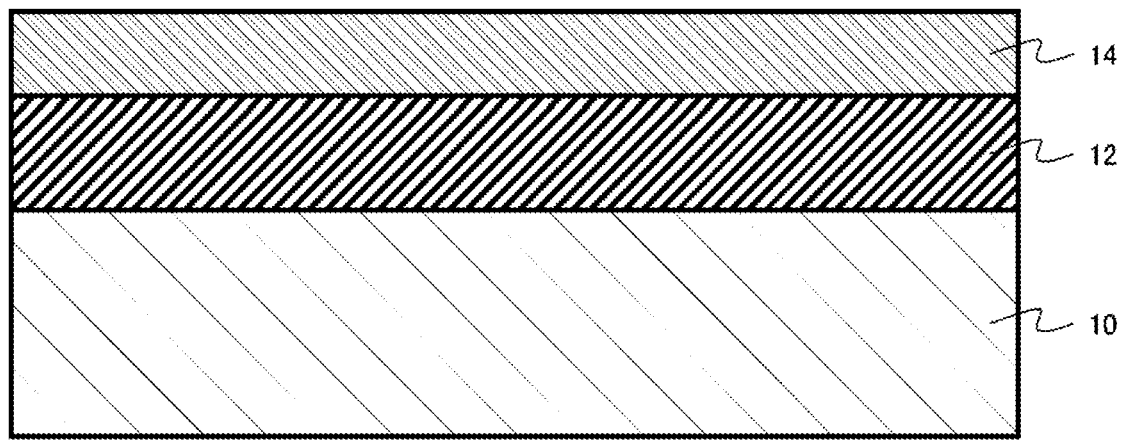
FIGS. 1-5 depict schematic cross-sectional views for explaining aspects of a method of manufacturing a semiconductor device according to a first embodiment.

In general, according to one embodiment, a pattern forming method includes forming an organic layer on a first layer. The organic layer includes a first region having a first thickness and a first width, a second region having a second thickness and a second width, and a third region, located between the first region and the second region, that has a third thickness less than the first thickness and the second thickness and a third width. A second layer containing silicon oxide is formed on a surface of the organic layer in a process chamber of a reactive ion etching device. The third region is then etched in the process chamber using the second layer as a mask.

Hereinafter, embodiments of the present disclosure will be described with reference to the drawings. In the following description, the same or similar members and the like will be denoted by the same reference numerals, and members that have been once described will not be described as appropriate.

Qualitative and quantitative analyses of a chemical composition of a materials and/or components used in a pattern forming method and a method of manufacturing a semiconductor device in the present specification may be conducted by, for example, secondary ion mass spectrometry (SIMS) and energy dispersive X-ray spectroscopy (EDX). For measurements of thicknesses, distances, or other dimensions, a scanning electron microscope (SEM) or a transmission electron microscope (TEM) may be used.

Hereinafter, a pattern forming method and a method of manufacturing a semiconductor device according to example embodiments will be described with reference to the drawings.

First Embodiment

A pattern forming method according to a first embodiment includes forming, on a surface of a first layer, an organic layer which includes a first region having a first thickness and a first width, a second region having a second thickness and a second width, and a third region located between the first region and the second region and having a third thickness smaller than the first thickness and the second thickness and a third width, forming a second layer containing silicon oxide on a surface of the organic layer in a process chamber of a reactive ion etching device, and etching the third region using the second layer as a mask in the process chamber.

A method of manufacturing a semiconductor device according to the first embodiment includes forming a first layer on a semiconductor substrate and forming a pattern on the semiconductor substrate by using the pattern forming method.

FIGS. 1 to 5 and 7 to 10 are schematic cross-sectional views showing an example of a method of manufacturing a semiconductor device according to the first embodiment. FIG. 6 is a schematic diagram of a reactive ion etching device used in this example method of manufacturing a semiconductor device according to the first embodiment.

In the first embodiment, a case of forming a pattern by using a nano-imprinting method will be described as an example. In the first embodiment, a patterned metal layer for a line and space pattern is formed by using a nano-imprinting method and will be described as an example.

First, a semiconductor substrate 10 is prepared. The semiconductor substrate 10 is made of, for example, single crystal silicon.

Next, an insulating layer 12 is formed on the semiconductor substrate 10. The insulating layer 12 is formed by using, for example, a chemical vapor deposition (CVD) method. The insulating layer 12 is made of, for example, silicon oxide or silicon nitride.

Next, a metal layer 14 is formed on the insulating layer 12. The metal layer 14 is an example of a first layer. The metal layer 14 is a layer to be processed on which the pattern is formed.

The metal layer 14 is formed by using, for example, a CVD method. The metal layer 14 is made of, for example, tungsten, titanium nitride, or aluminum.

Figure 2:
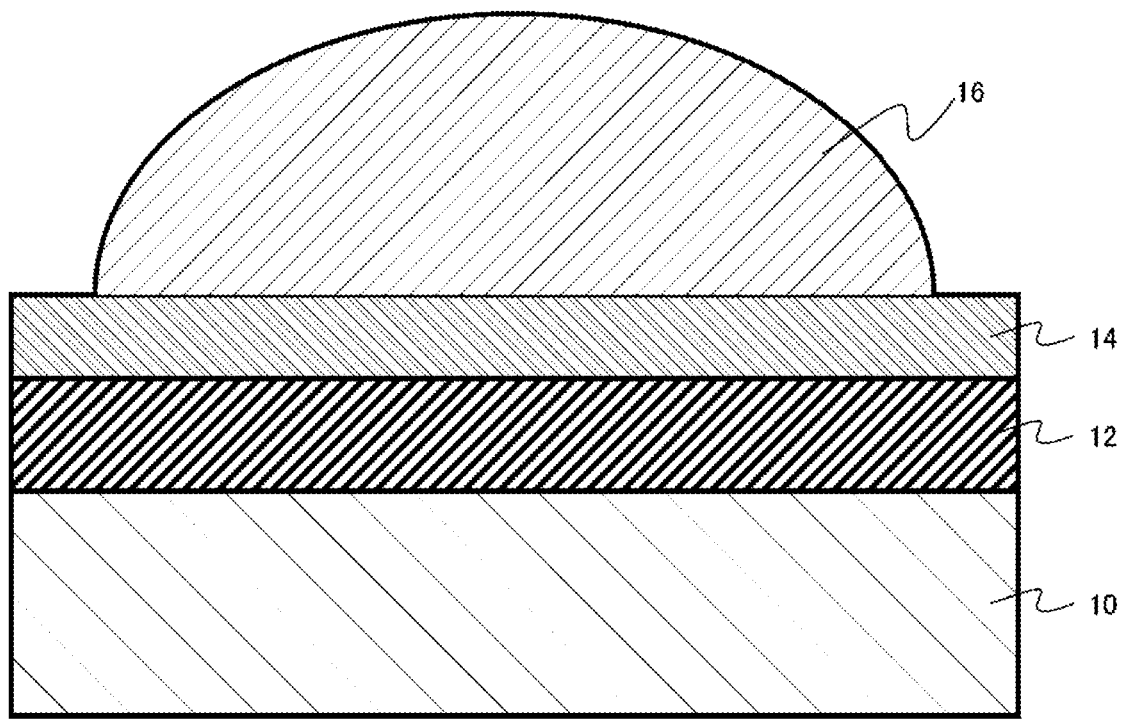

Next, as depicted in FIG. 2, a resist 16 is supplied to a surface of the metal layer 14. The resist 16 is dispensed onto the surface of the metal layer 14 by using an ink jet method. The resist 16 can instead be applied onto the surface of the metal layer 14 by using a spin coat method or the like.

The resist 16 is initially liquid or substantially flowable. Resist 16 can be referred to as a nano-imprinting resist. The resist 16 comprises, for example, a photocurable resin, a thermosetting resin, or precursors of such materials.

Figure 3:
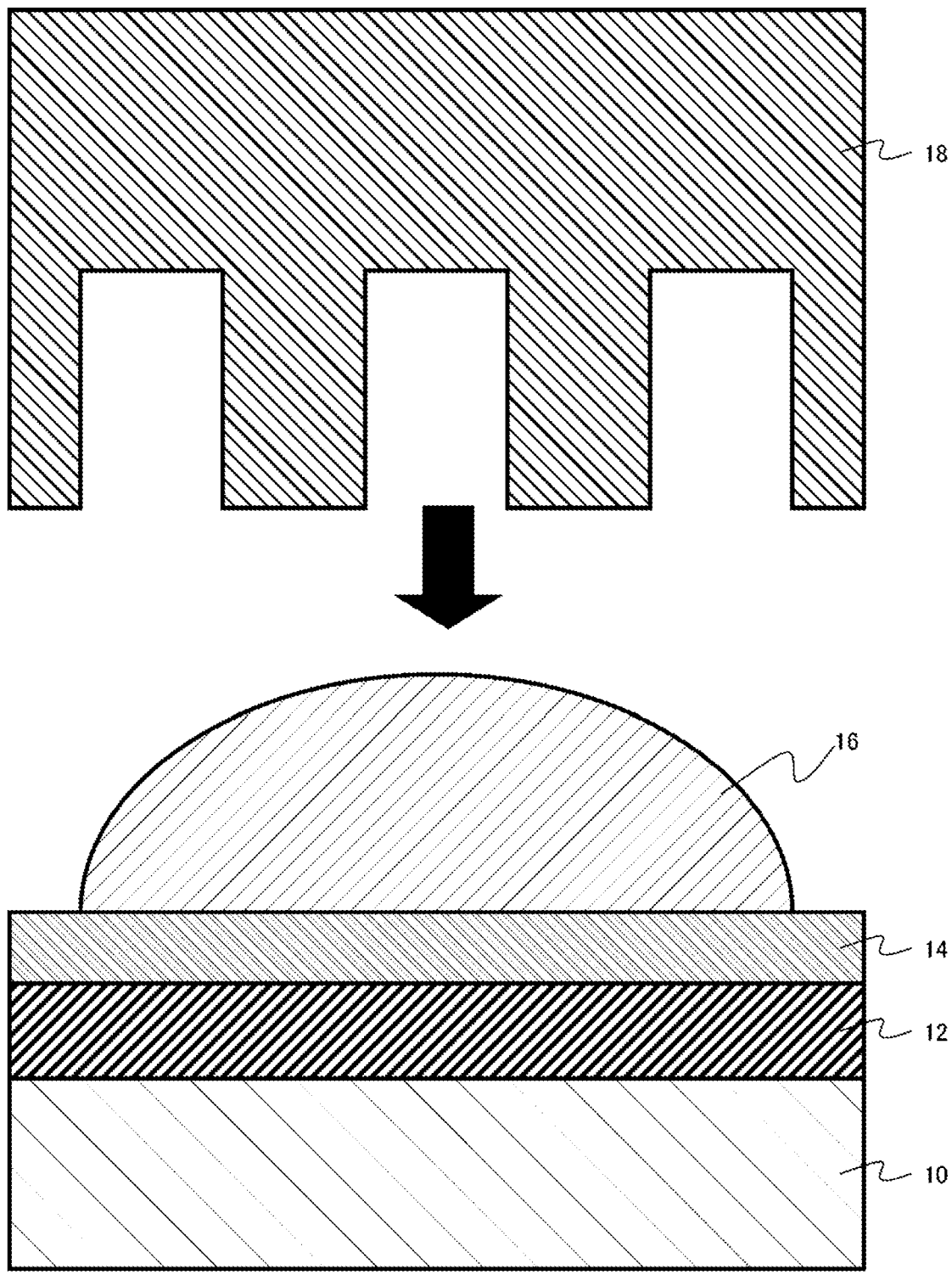

Next, as depicted in FIG. 3, a template 18 (mold) having a pattern is brought into contact with the resist 16 on the surface of the metal layer 14. For example, when the resist 16 contains a photocurable resin, a material of the template 18 is used for a light transmissive material. The template 18 is made of, for example, quartz glass.

Figure 4:
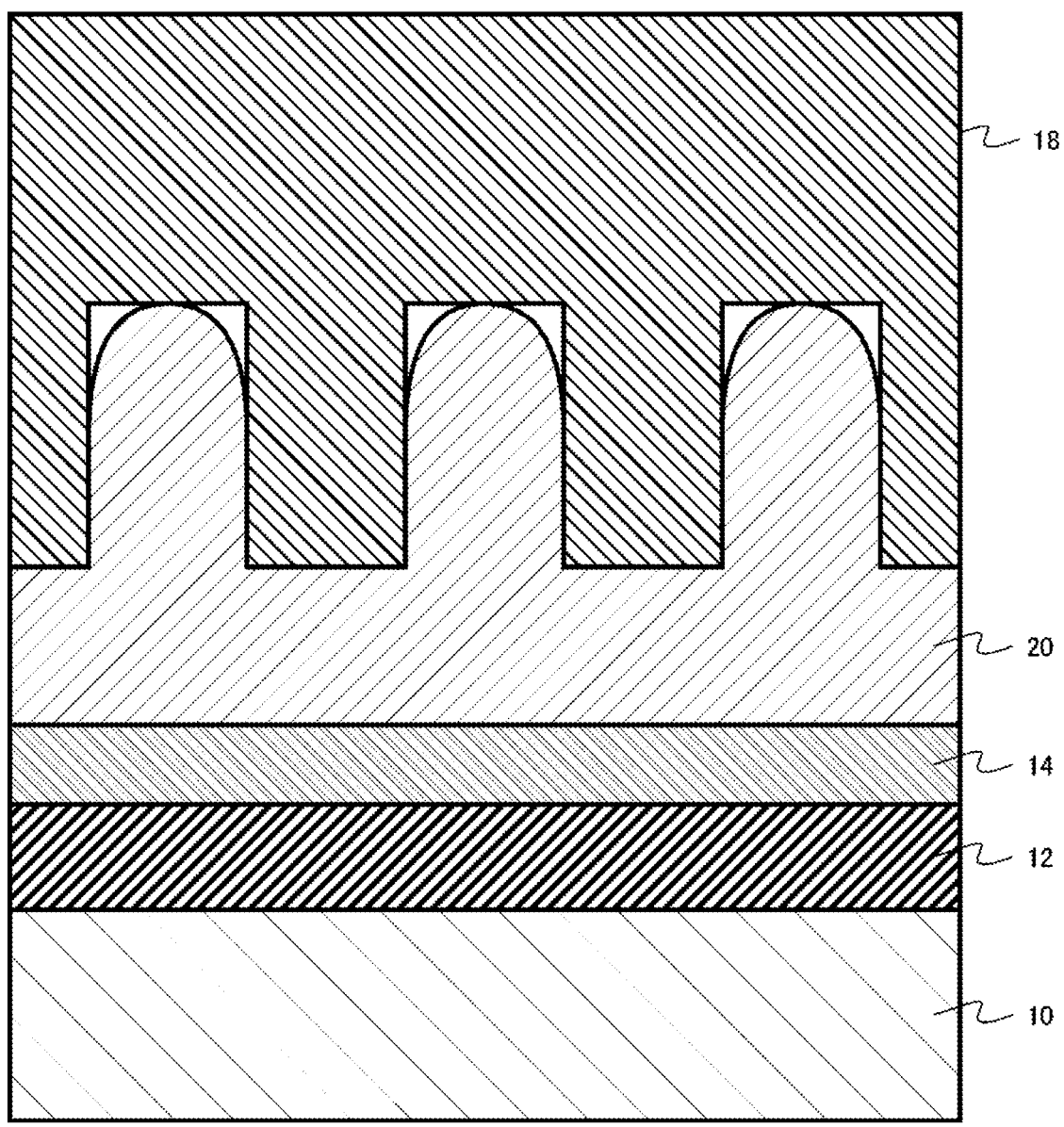

The template 18 is brought into contact with the resist 16 on the surface of the metal layer 14, such that the resist 16 is sucked up into a recess portion of the template 18 by capillary action. The pattern of the template 18 is transferred to the resist 16 to form a cured resist layer 20 on the surface of the metal layer 14 (FIG. 4). The resist layer 20 is an example of an organic layer.

After the patterned and cured resist layer 20 is formed, the template 18 is separated from the resist layer 20.

Figure 5:
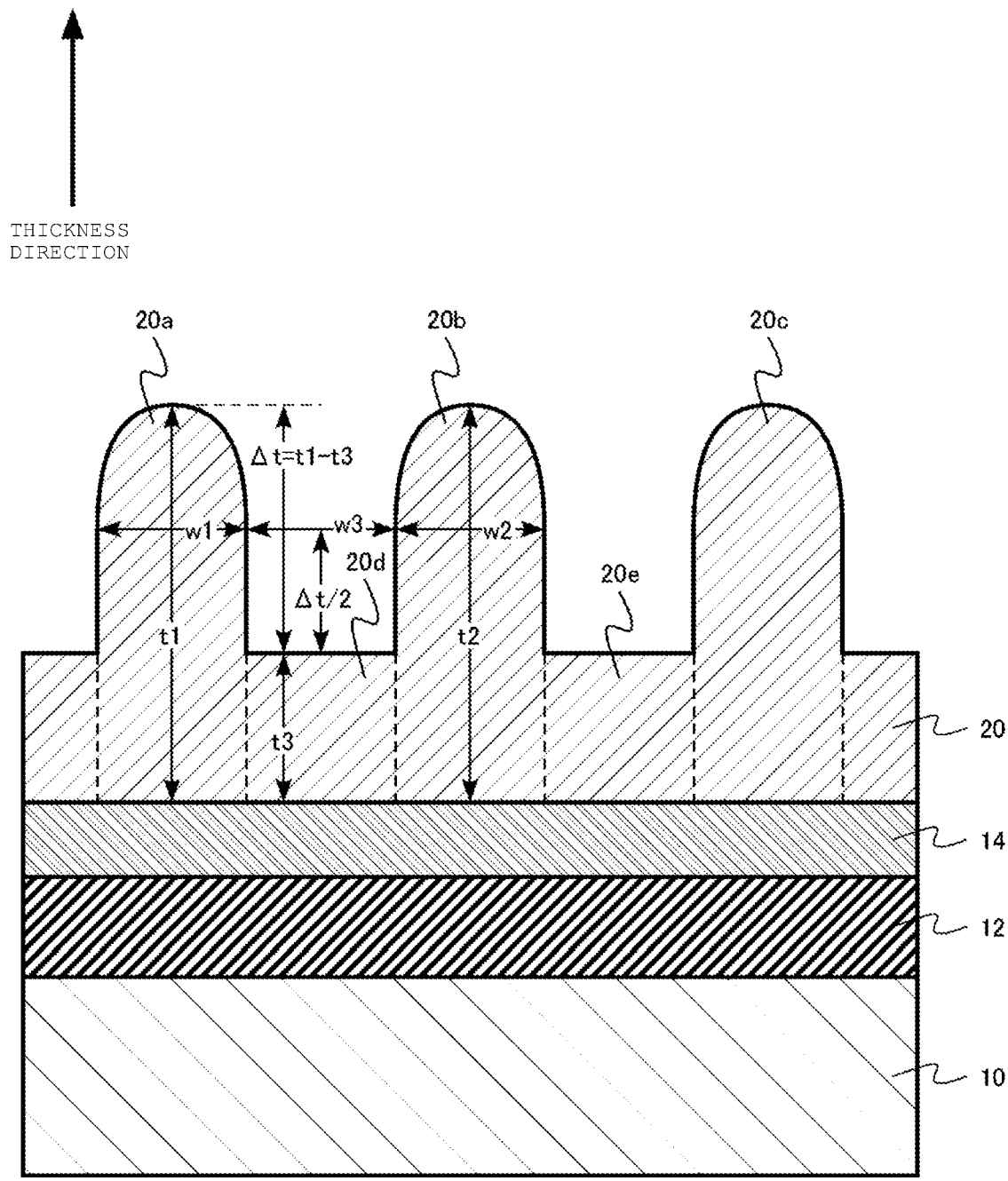
Figure 6:
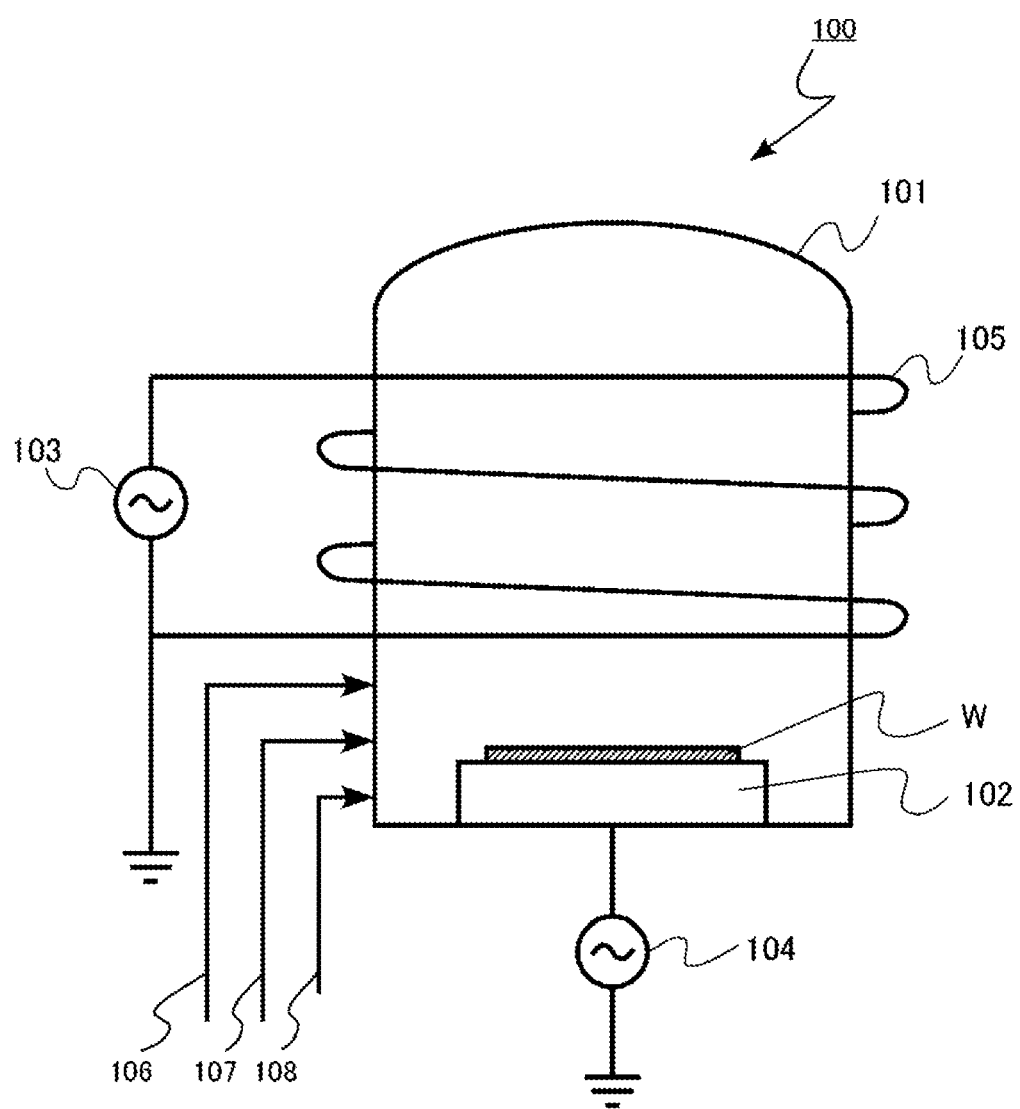
FIG. 6 is a schematic diagram of a reactive ion etching device used in a method of manufacturing a semiconductor device according to a first embodiment.

FIG. 5 shows a cross section parallel to a thickness direction of the resist layer 20. The resist layer 20 includes a projected region 20a (first region), a projected region 20b (second region), a projected region 20c, a recessed region 20d (third region), and a recessed region 20e. The recessed region 20d is located between the projected region 20a and the projected region 20b.

In the resist layer 20, a plurality of projected regions including the projected region 20a, the projected region 20b, and the projected region 20c are arranged repeatedly. In addition, in the resist layer 20, a plurality of recessed regions including the recessed region 20d and the recessed region 20e are arranged repeatedly.

The projected region 20a has a first thickness (t1 in FIG. 5) and a first width (w1 in FIG. 5). The recessed region 20b has a second thickness (t2 in FIG. 5) and a second width (w2 in FIG. 5). The recessed region 20d has a third thickness (t3 in FIG. 5) and a third width (w3 in FIG. 5). The third thickness t3 is smaller than the first thickness t1 and the second thickness t2.

The first thickness t1 is the maximum value of a distance from the surface of the metal layer 14 to a (upper) surface of the projected region 20a. In addition, the second thickness t2 is the maximum value of a distance from the surface of the metal layer 14 to a surface of the projected region 20b. In addition, the third thickness t3 is the minimum value of a distance from the surface of the metal layer 14 to a surface of the recessed region 20d.

A value obtained by dividing the difference between the first thickness t1 and the third thickness t3 ($\Delta t = t1 - t3$ in FIG. 5) by the third width w3 is referred to as the aspect ratio of the pattern of the resist layer 20. The aspect ratio of the pattern of the resist layer 20 is in a range of, for example, 1 to 3.

The first width w1, the second width w2, and the third width w3 are widths taken at a distance from the surface of the metal layer 14 equal to $t3 + \Delta t/2$.

For example, the first thickness t1 and the second thickness t2 are equal. In addition, for example, the first width w1 and the second width w2 are equal.

The first thickness t1 is in a range of, for example, 20 nm to 100 nm. The third thickness t3 is in a range of, for example, 10 nm to 20 nm.

For example, a sum of the first width w1 and the third width w3 is in a range of 10 nm to 40 nm. That is, pitch of the projected regions repeatedly arranged is in a range of, for example, 10 nm to 40 nm. In other example, the pitch of the projected regions repeatedly arranged is in a range of, for example, 5 nm to 20 nm.

The first width w1 is in a range of, for example, 5 nm to 20 nm. The third width w3 is, for example, less than or equal to 40 nm. The third width w3 is in a range of, for example, 5 nm to 20 nm.

FIG. 6 is a schematic diagram of a reactive ion etching device used in the method of manufacturing a semiconductor device according to the first embodiment. A reactive ion etching device 100 is a device using, for example, an inductively coupled plasma (ICP).

The reactive ion etching device 100 includes a process chamber 101, a holder 102, a source power supply 103, a bias power supply 104, an induction coil 105, a first gas supply pipe 106, a second gas supply pipe 107, and a third gas supply pipe 108.

The holder 102 is provided in the process chamber 101. A substrate W (sample) is placed on the holder 102. The holder 102 is, for example, an electrostatic chuck.

The source power supply 103 has a function of applying a first high frequency power to the induction coil 105. The first high frequency power is applied to the induction coil 105, such that a plasma is generated in the process chamber 101.

The bias power supply 104 has a function of applying a second high frequency power to the holder 102.

The first gas supply pipe 106 supplies first gas to the process chamber 101. The second gas supply pipe 107 supplies second gas to the process chamber 101. The third gas supply pipe 108 supplies third gas to the process chamber 101.

The first gas contains, for example, silicon (Si). The first gas is, for example, silicon tetrachloride ($SiCl_4$) gas. The second gas contains, for example, oxygen (O). The second gas is, for example, oxygen ($O_2$) gas. The third gas is, for example, hydrogen bromide (HBr) gas.

For example, under some process conditions, the reactive ion etching device 100 deposits a film on a surface of the substrate W placed on the holder 102 using the plasma generated in the process chamber 101. In addition, for example, under some process conditions, the reactive ion etching device 100 anisotropically etches the substrate W placed on the holder 102 using the plasma generated in the process chamber 101.

After the resist layer 20 is formed, the semiconductor substrate 10 is introduced in the process chamber 101 of the reactive ion etching device 100. The semiconductor substrate 10 is placed on the holder 102.

Figure 7:
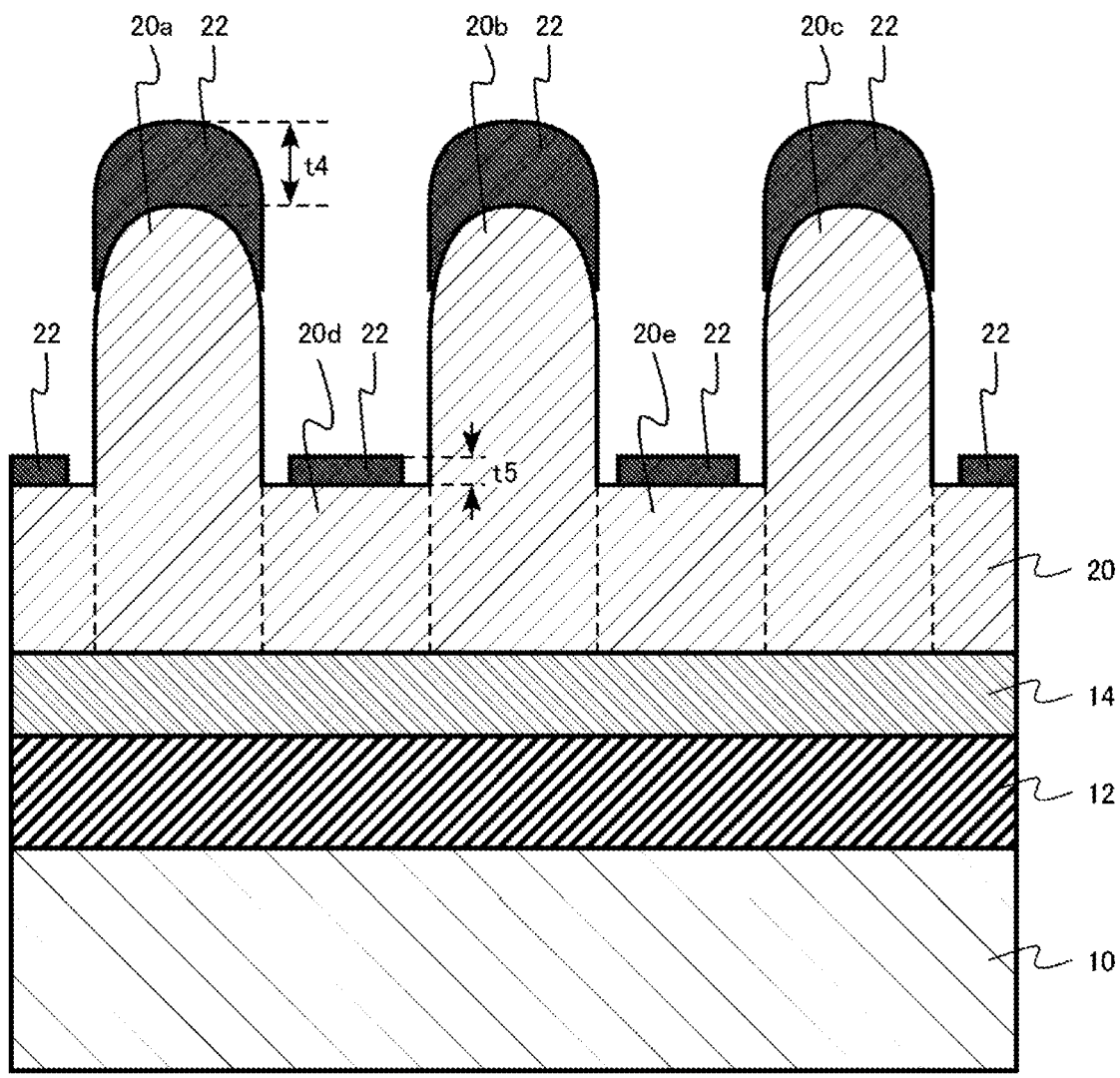
FIGS. 7-10 depict schematic cross-sectional views for explaining additional aspect of a method of manufacturing a semiconductor device according to a first embodiment.

In the process chamber 101, a mask layer 22 (second layer) containing silicon oxide is formed on a surface of the resist layer 20 (see FIG. 7). The mask layer 22 has, for example, silicon oxide as a main component. The mask layer 22 is primarily formed only on upper portions of the projected region 20a, 20b, 20c and need not be substantially formed on the recessed regions 20d, 20e or the side surfaces of the projected regions 20a, 20b, 20c.

When the mask layer 22 is being formed in the process chamber 101 of the reactive ion etching device 100, silicon tetrachloride ($SiCl_4$) gas is supplied from the first gas supply pipe 106 to the process chamber 101 and oxygen ($O_2$) gas is supplied from the second gas supply pipe 107 to the process chamber 101, for example. Then, the process chamber 101 is held at a first pressure. Then, the first high frequency power is applied to the induction coil 105, such that a plasma is generated in the process chamber 101. The mask layer 22 containing silicon oxide is deposited on the surface of the resist layer 20 by a chemical vapor deposition method.

A plasma discharge time is in a range of, for example, two seconds to ten seconds. The plasma discharge time is a time when the first high frequency power is applied to the induction coil 105.

The first pressure is in a range of, for example, 30 mTorr to 80 mTorr. The first high frequency power is, for example, 13 MHz and 250 W.

A fourth thickness of the mask layer 22 on the projected region 20a (t4 in FIG. 7) is greater than a fifth thickness of the mask layer 22 on the recessed region 20d (t5 in FIG. 7). The third thickness t3 is, for example, between five and fifty times the fourth thickness t4. The fourth thickness is the maximum value of the thickness of the mask layer 22 on the projected region 20a.

The fourth thickness t4 is in a range of, for example, 2 nm to 10 nm. The fifth thickness t5 is, for example, greater than 0 nm and less than or equal to 2 nm.

Figure 8:
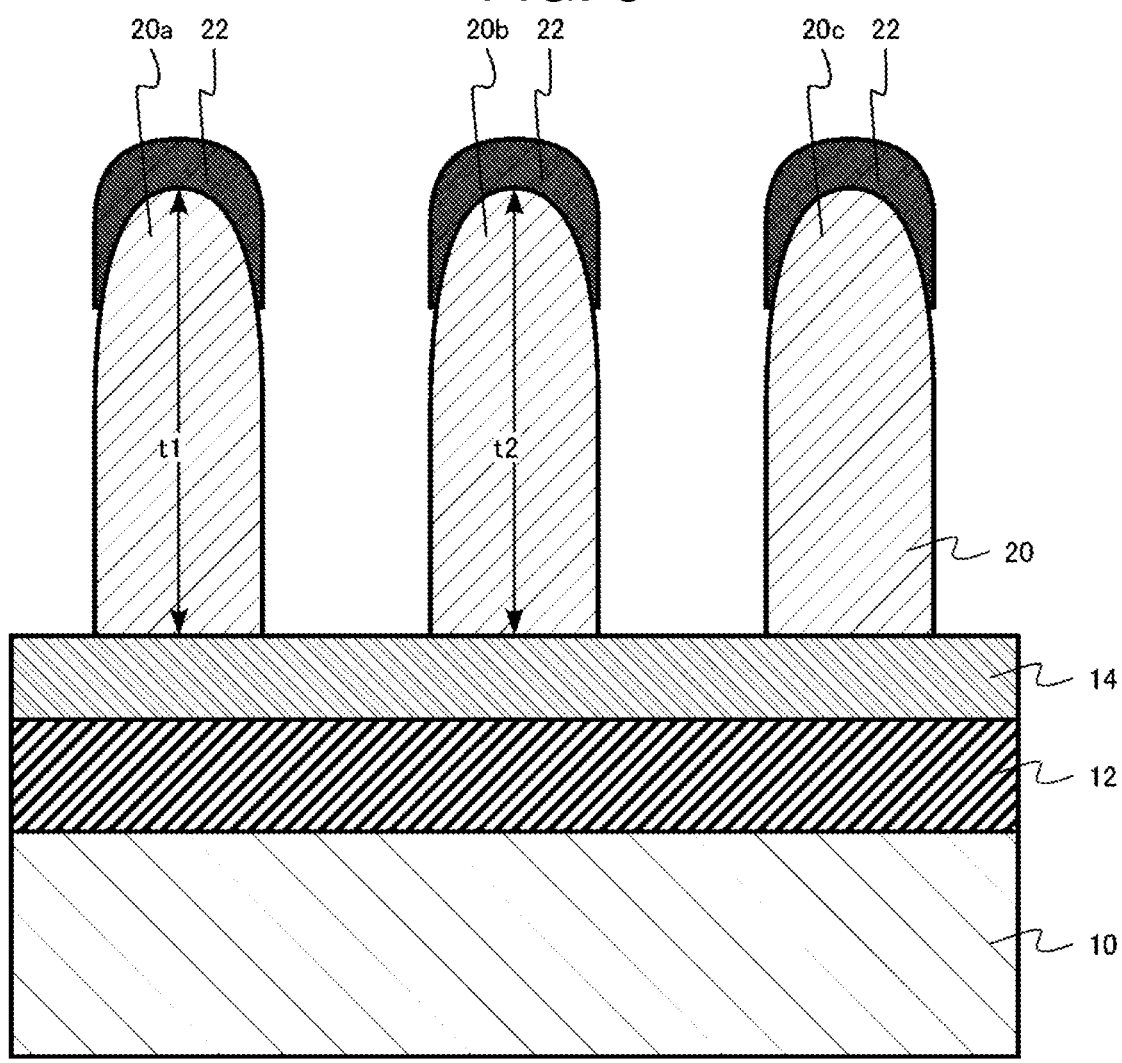

After the resist layer 20 has been formed, the recessed region 20d of the resist layer 20 is etched using the mask layer 22 as a mask in the process chamber 101 of the reactive ion etching device 100 (FIG. 8). The recessed region 20d of the resist layer 20 is selectively etched with respect to the projected region 20a due to differential thicknesses of the mask layer 22 present in region.

When the recessed region 20d of the resist layer 20 is etched in the process chamber 101, oxygen ($O_2$) gas is supplied from the second gas supply pipe 107 to the process chamber 101 and hydrogen bromide (HBr) gas is supplied from the third gas supply pipe 108 to the process chamber 101, for example. Then, the process chamber 101 is held at a second pressure. Then, the second high frequency power is applied to the induction coil 105, such that a plasma is generated in the process chamber 101. Then, a third high frequency power is applied to the holder 102 to etch the recessed region 20d.

The second pressure is in a range of, for example, 5 mTorr to 30 mTorr. The second high frequency power is, for example, 13 MHz and 350 W. In addition, the third high frequency power is, for example, 13 MHz and 100 W.

The first pressure is generally higher than the second pressure. The first pressure is, for example, between two times and ten times the second pressure.

Figure 9:
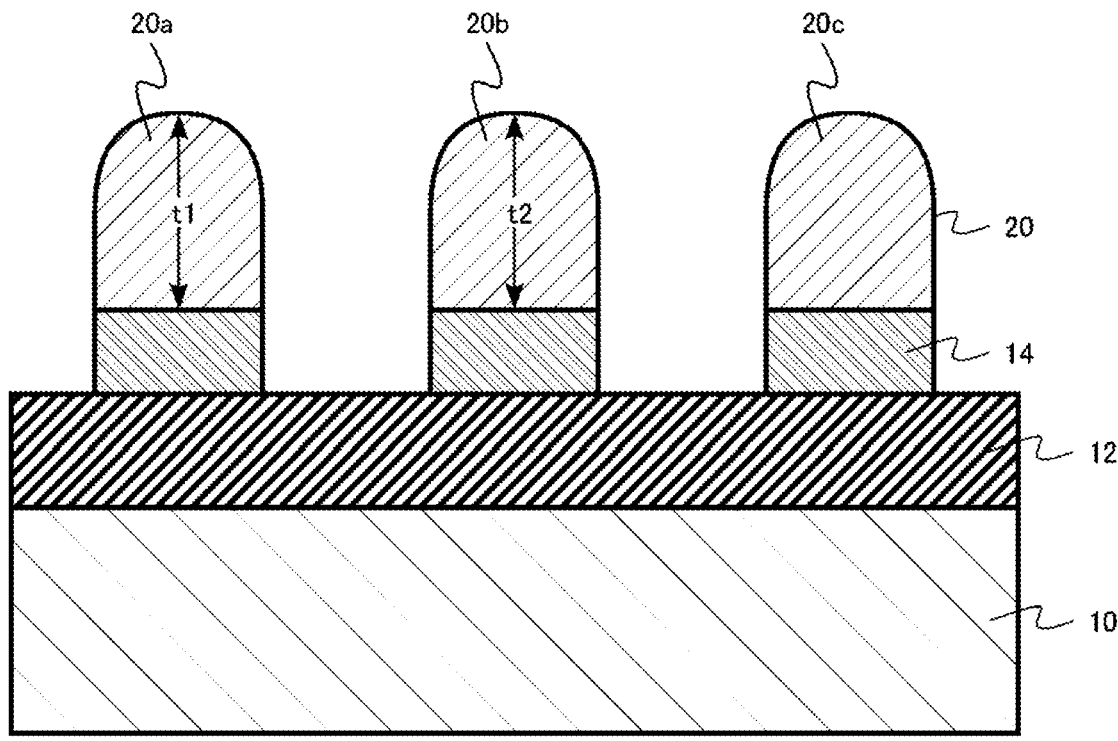

Next, the metal layer 14 is etched using the remaining portions of the mask layer 22 and the resist layer 20 as a mask (FIG. 9). The metal layer 14 is patterned by etching in this example. The etching of the metal layer 14 is performed in this example using a reactive ion etching device that is different from the reactive ion etching device 100 which is used for etches of the recessed region 20d of the resist layer 20.

When the metal layer 14 is etched, the mask layer 22 on the projected region 20a can be completely removed by the etching, such that the first thickness t1 of the projected region 20a is reduced, for example.

Figure 10:
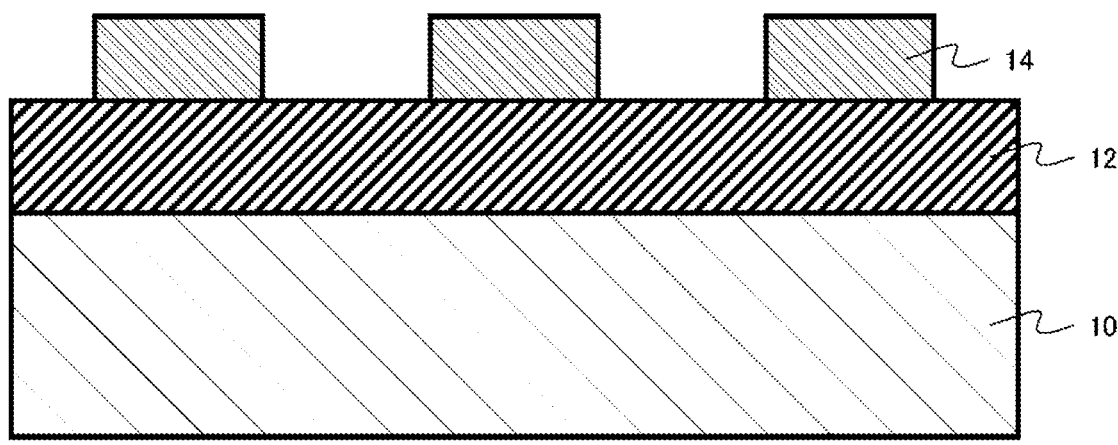

Next, the resist layer 20 remaining on the patterned metal layer 14 is removed (FIG. 10).

A pattern of the metal layer 14 is formed on the semiconductor substrate 10 by the above method of manufacturing a semiconductor device.

Hereinafter, operations and effects of the method of manufacturing a semiconductor device according to the first embodiment will be described.

Figure 11:
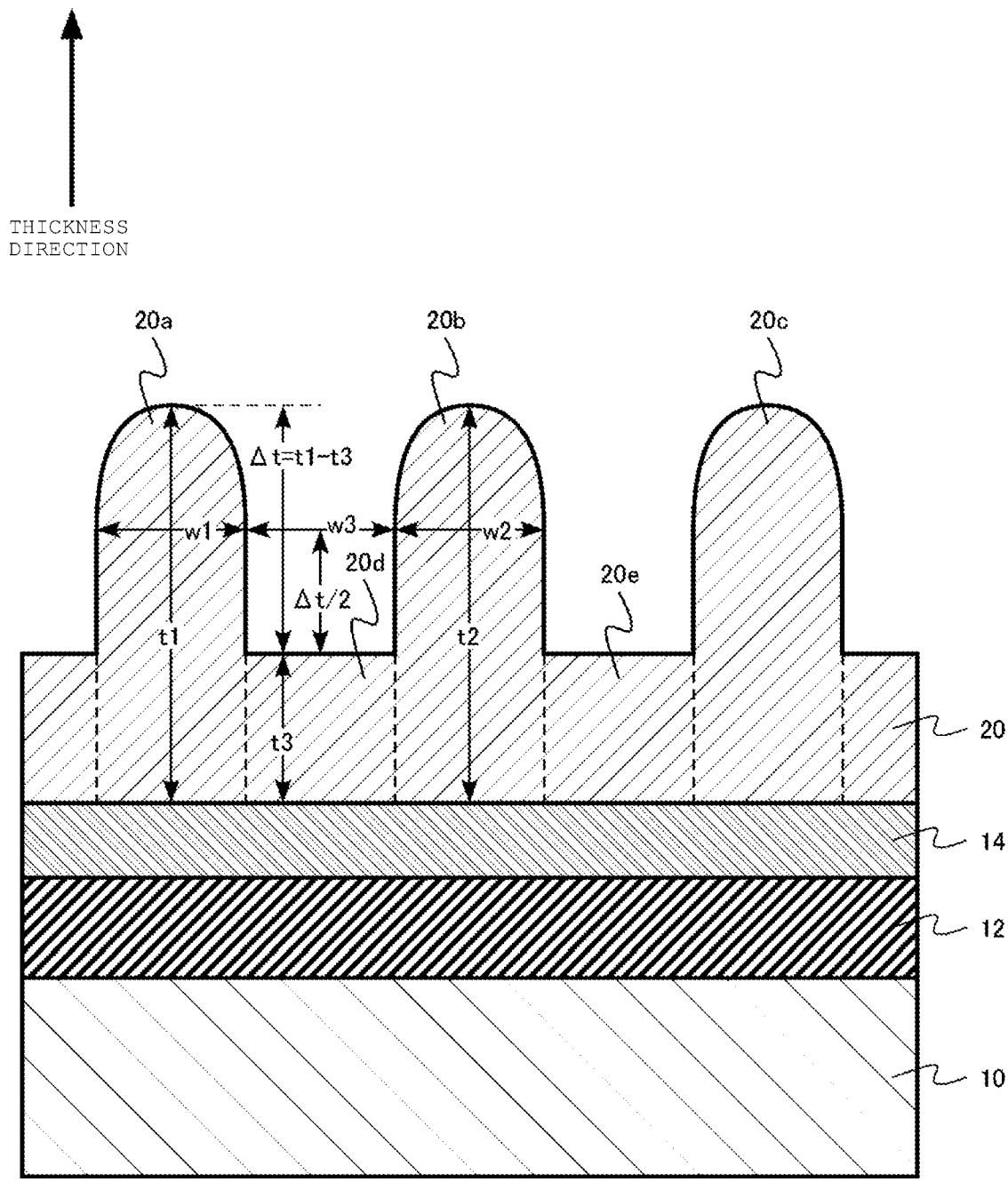
FIGS. 11-13 depict schematic cross-sectional views for explaining aspects of a method of manufacturing a semiconductor device according to a comparative example.
Figure 12:
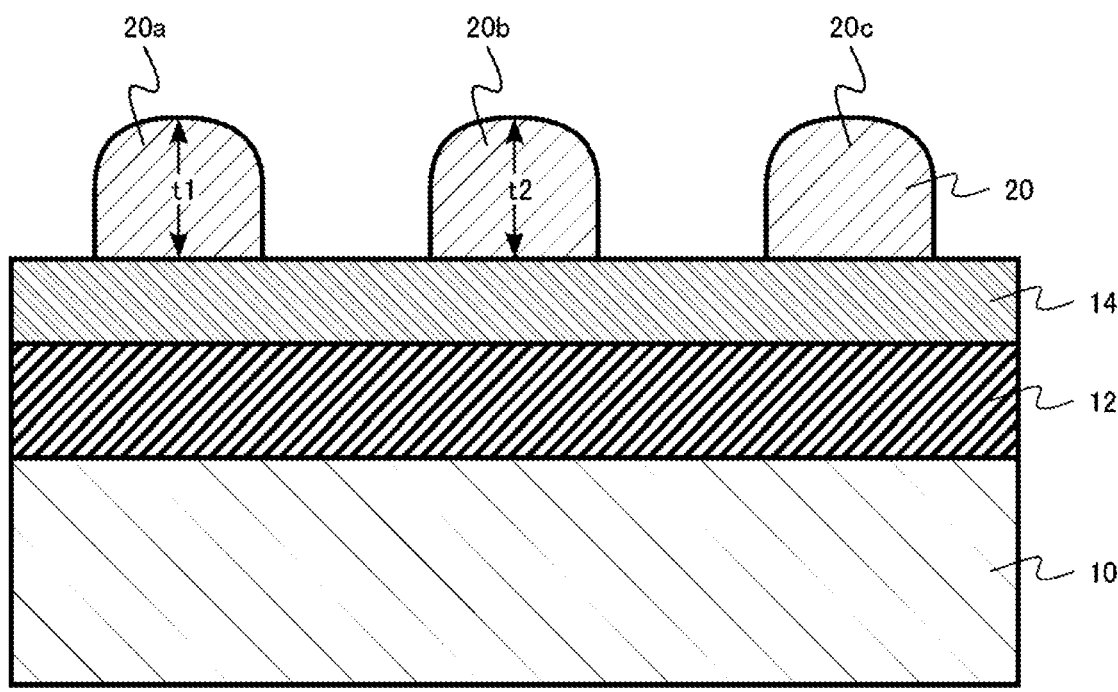
Figure 13:
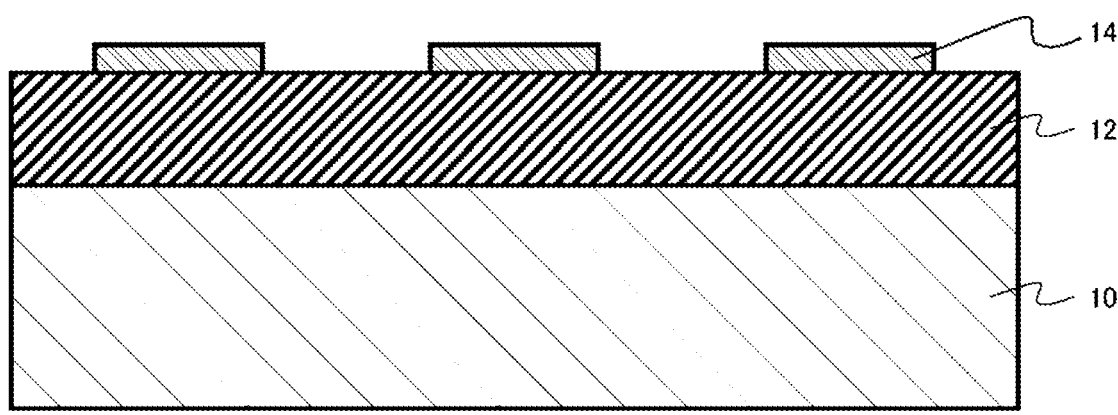

FIGS. 11 to 13 are schematic cross-sectional views showing the method of manufacturing a semiconductor device according to a comparative example. The method of manufacturing a semiconductor device according to the comparative example is different from the method of manufacturing a semiconductor device according to the first embodiment in that the mask layer 22 is not formed on the surface of the resist layer 20.

FIG. 11 is a cross-sectional view showing a state in which the patterned resist layer 20 is on the surface of the metal layer 14. FIG. 11 is similar to the cross-sectional view in FIG. 5 of the method of manufacturing a semiconductor device according to the first embodiment.

In the resist layer 20 formed by the nano-imprinting method, the recessed region 20d having the thickness smaller than that of the projected region 20a is formed between the projected region 20a and the projected region 20b. If the recessed region 20d is not present on the resist layer 20, for example, since a projected portion of the template 18 and the surface of the metal layer 14 are adsorbed, the template 18 is hard to be separated from the resist layer 20.

The patterned resist layer 20 is formed on the surface of the metal layer 14, and then the recessed region 20d is removed (FIG. 12). For example, the recessed region 20d is removed by reactive ion etching using oxygen ($O_2$) gas and hydrogen bromide (HBr) gas. Since the projected region 20a is etched at the same time as recessed region 20d, the first thickness t1 of the projected region 20a is reduced.

Next, the metal layer 14 is etched using just the remaining resist layer 20 as a mask (FIG. 13). The metal layer 14 is patterned by etching. If the first thickness t1 of the projected region 20a before metal etching is small then, for example, the projected region 20a disappears during the etching of the metal layer 14 and thus during the etching of the metal layer 14 of a portion initially under the projected region 20a may be undesirably etched and thus the remaining portion of the metal layer 14 intended to remain as apart of a line pattern is thinned and/or etched in an unintended manner. Therefore, a problem that the thickness of the metal layer 14 after patterning becomes too small, the width of the metal layer 14 becomes too narrow, or even that the metal layer 14 disappears completely, may arise.

The problem becomes significant, for example, when the pattern is finer. For example, the problem becomes significant when a line and space pitch less than or equal to 40 nm.

When the pattern is finer, it is hard to make the third thickness t3 of the recessed region 20d small in terms of separation of the template 18 from the resist layer 20. In addition, when the pattern is finer, it is hard to make the first thickness t1 of the projected region 20a larger. When the first thickness t1 is increased after the first width w1 of the projected region 20a is reduced, the projected region 20a is formed to be longer in the thickness direction. Therefore, when the template 18 is being separated from the resist layer 20, the projected region 20a may be peeled off from the semiconductor substrate 10 together with the template 18.

For this reason, when the pattern becomes finer, the first thickness t1 of the projected region 20a is typically reduced while the third thickness t3 of the recessed region 20d is substantially maintained. Accordingly, as the pattern becomes finer, the first thickness t1 of the remaining projected region 20a etching the recessed region 20d will also be reduced. Thus, the first thickness t1 of the projected region 20a before etching of the metal layer 14 may be insufficient, thus the thickness of the metal layer 14 after patterning may be reduced, or the metal layer 14 disappears.

In the method of manufacturing a semiconductor device according to the first embodiment, the mask layer 22 containing silicon oxide is formed on the surface of the resist layer 20 before removing the recessed region 20d, as shown in FIG. 7. Therefore, as shown in FIG. 8, when the recessed region 20d is removed, the projected region 20a is not significantly etched, and the first thickness t1 of the projected region 20a does not substantially change even after the recessed region 20d is removed. Accordingly, the first thickness t1 of the projected region 20a is not insufficient before the metal layer 14 is etched. Thus, problems with the thickness of the metal layer 14 being reduced, the width of the metal layer 14 being reduced, or the metal layer 14 disappearing, may not arise.

There is a case in which the mask layer 22 is also initially present on the recessed region 20d when the recessed region 20d is being removed. However, as shown in FIG. 7, the fifth thickness t5 of the mask layer 22 on the recessed region 20d is smaller than the fourth thickness t4 of the mask layer 22 on the projected region 20a. Therefore, the mask layer 22 on the recessed region 20d can be completely removed by etching when the recessed region 20d is removed while still leaving a portion of the mask layer 22 on the projected region 20a.

In the method of manufacturing a semiconductor device according to the first embodiment, the mask layer 22 is formed in the same process chamber 101 which is used for the etching of the recessed region 20d. The deposition of the mask layer 22 on the surface of the resist layer 20 and the etching of the recessed region 20d of the resist layer 20 are thus performed in the same process chamber 101, back-to-back, thereby shortening the manufacturing time of the semiconductor device. In addition, since the deposition of the mask layer 22 and the etching of the recessed region 20d are performed in the same process chamber 101, generation of defects caused by taking the semiconductor substrate 10 out of the process chamber 101 can be avoided. Therefore, the yield of the semiconductor devices is improved.

The fourth thickness t4 of the mask layer 22 on the projected region 20a is preferably five times or more the fifth thickness t5 of the mask layer 22 on the recessed region 20d, and more preferably ten times or more. By increasing the relative thickness of the fourth thickness t4, it is possible to more surely keep the mask layer 22 on the projected region 20a when the recessed region 20d is removed by etching.

The fifth thickness t5 of the mask layer 22 on the recessed region 20d is preferably less than or equal to 2 nm.

The fourth thickness t4 of the mask layer 22 on the projected region 20a is preferably greater than or equal to 2 nm.

The fourth thickness t4 of the mask layer 22 provided on the projected region 20a is preferably less than or equal to 10 nm. By keeping to this thickness or less, it is possible to limit the fifth thickness t5 of the mask layer 22 formed on the recessed region 20d to a manageable amount.

The aspect ratio of the pattern of the resist layer 20 is preferably greater than or equal to 1, more preferably greater than or equal to 1.5, and still more preferably greater than or equal to 2. When the aspect ratio of the pattern of the resist layer 20 is increased, depositing speed of the mask layer 22 on the recessed region 20d during the forming the mask layer 22 is decreased as compared with a depositing speed of the mask layer 22 on the projected region 20a.

The fifth thickness t5 of the mask layer 22 provided on the recessed region 20d is preferably greater than or equal to 0 and more preferably greater than or equal to 0.5 nm. In this range, the mask layer 22 on the recessed region 20d tends to re-adhere on a side surface of the projected region 20a by being sputtered during etch processing and thus functions as a side wall protective film, when the recessed region 20d is being removed. Therefore, the etching of the side surface of the projected region 20a is limited when the recessed region 20d is being removed. Thus, reduction in the first width w1 of the projected region 20a is limited when the recessed region 20d is being removed.

It is preferable that the first pressure in the process chamber 101 at the time of forming the mask layer 22 is higher than the second pressure in the process chamber 101 at the time of etching the recessed region 20d.

As the first pressure when the mask layer 22 is deposited by a vapor phase growth method becomes higher, a depositing speed of the mask layer 22 becomes faster. By shortening deposition time of the mask layer 22, it is possible to limit the increase in the fifth thickness t5 of the mask layer 22 on the recessed region 20d.

In addition, when the second pressure in the process chamber 101 during the etching the recessed region 20d becomes lower, etching of the side surface of the projected region 20a is reduced. Thus, reductions in the first width w1 of the projected region 20a is prevented.

If increase in the fifth thickness t5 of the mask layer 22 on the recessed region 20d is prevented, then the mask layer 22 on the recessed region 20d can be more surely removed and a reduction in the first width w1 of the projected region 20a can be prevented. As such, it is preferable that the first pressure be higher than the second pressure. For example, the first pressure is preferably two times or more greater than the second pressure. And more preferably the first pressure is three times or more greater than the second pressure.

The sum of the first width w1 and the third width w3 is preferably less than or equal to 40 nm. That is, pitch of the projected regions repeatedly arranged is, for example, preferably less than or equal to 40 nm.

It is preferable that the reactive ion etching device 100 used in the formation of the mask layer 22 is a device using an inductively coupled plasma. The device using the inductively coupled plasma can stabilize and generate a high-density plasma. Therefore, it is possible to form a mask layer 22 having a small thickness.

Hereinafter, according to the pattern forming method and the method of manufacturing a semiconductor device of the first embodiment, it is possible to form a fine pattern.

Second Embodiment

In a pattern forming method according to a second embodiment, the organic layer includes a fourth region having a sixth thickness less than a first thickness and a fourth width greater than a third width. A second layer formed on the fourth region is removed before etching of the third region, which is different in this regard from the pattern forming method of the first embodiment. In other regards, the second embodiment is similar to the first embodiment and repeated description of such similar aspects may be omitted from the following description of the second embodiment.

FIGS. 14 to 21 are schematic cross-sectional views showing an example of the method of manufacturing a semiconductor device according to the second embodiment.

In the second embodiment, the case of forming a pattern by using a nano-imprinting method will be described as one possible example. In the second embodiment, a metal layer having a line and space pattern region and a wide space region is formed using a nano-imprinting method, but this just one possible example.

First, a semiconductor substrate 10 is prepared. The semiconductor substrate 10 is made of, for example, single crystal silicon.

Next, an insulating layer 12 is formed on the semiconductor substrate 10. The insulating layer 12 is formed by using, for example, a chemical vapor deposition (CVD) method. The insulating layer 12 is made of, for example, silicon oxide or silicon nitride.

Next, a metal layer 14 is formed on the insulating layer 12. The metal layer 14 is an example of a first layer. The metal layer 14 is the layer to be processed/patterned, which will remain in the final manufactured device, for example.

The metal layer 14 is formed by using, for example, a CVD method. The metal layer 14 is made of, for example, tungsten, titanium nitride, or aluminum.

Figure 14:
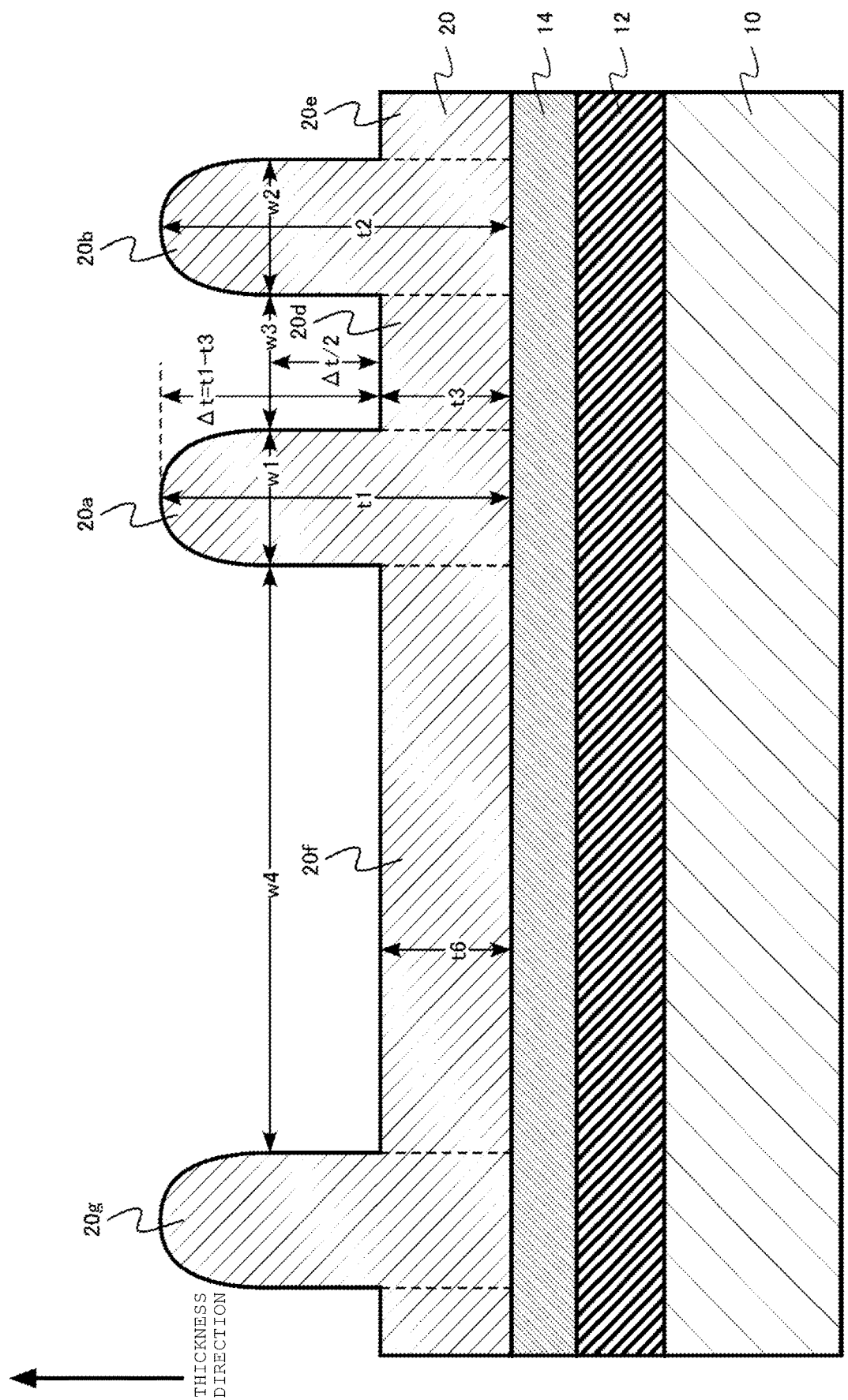
FIGS. 14-21 depict schematic cross-sectional views for explaining aspects of a method of manufacturing a semiconductor device according to a second embodiment.

Next, as depicted in FIG. 14, the resist layer 20 is formed on the surface of the metal layer 14 in a nano-imprinting method, which is substantially same as that described in the first embodiment.

FIG. 14 shows a cross section parallel to a thickness direction of the resist layer 20. The resist layer 20 includes a projected region 20a (first region), a projected region 20b (second region), a projected region 20g, a recessed region 20d (third region), a recessed region 20e, and a wide region 20f (fourth region). The recessed region 20d is located between the projected region 20a and the projected region 20b. The wide region 20f is located between the projected region 20a and the projected region 20g.

The projected region 20a has a first thickness (t1 in FIG. 14) and a first width (w1 in FIG. 14). The projected region 20b has a second thickness (t2 in FIG. 14) and a second width (w2 in FIG. 14). The recessed region 20d has a third thickness (t3 in FIG. 14) and a third width (w3 in FIG. 14). The wide region 20f has a sixth thickness (t6 in FIG. 14) and a fourth width (w4 in FIG. 14). The second thickness t2 and the fifth thickness t5 are smaller than the first thickness t1. In general, FIG. 14 depicts a dense pattern region (e.g., the region in which projected regions 20a and 20b are located) and a sparse pattern region (e.g., the region in which projected region 20g is located).

The aspect ratio of the pattern of the resist layer 20 is in a range of, for example, 1 to 3.

The first thickness t1 is in a range of, for example, 20 nm to 100 nm. The third thickness t3 is in a range of, for example, 10 nm to 20 nm. The sixth thickness t6 is in a range of, for example, 10 nm to 20 nm.

A sum of the first width w1 and the third width w3 is in a range of, for example, 10 nm to 40 nm. That is, pitch of the projected regions repeatedly arranged is in a range of, for example, 10 nm to 40 nm. In some examples, pitch of the projected regions repeatedly arranged is in a range of, for example, 5 nm to 20 nm.

The first width w1 is in a range of, for example, 5 nm to 20 nm. The third width w3 is in a range of, for example, 5 nm to 20 nm. The fourth width w4 is in a range of, for example, 50 nm to 100 μm.

Figure 15:
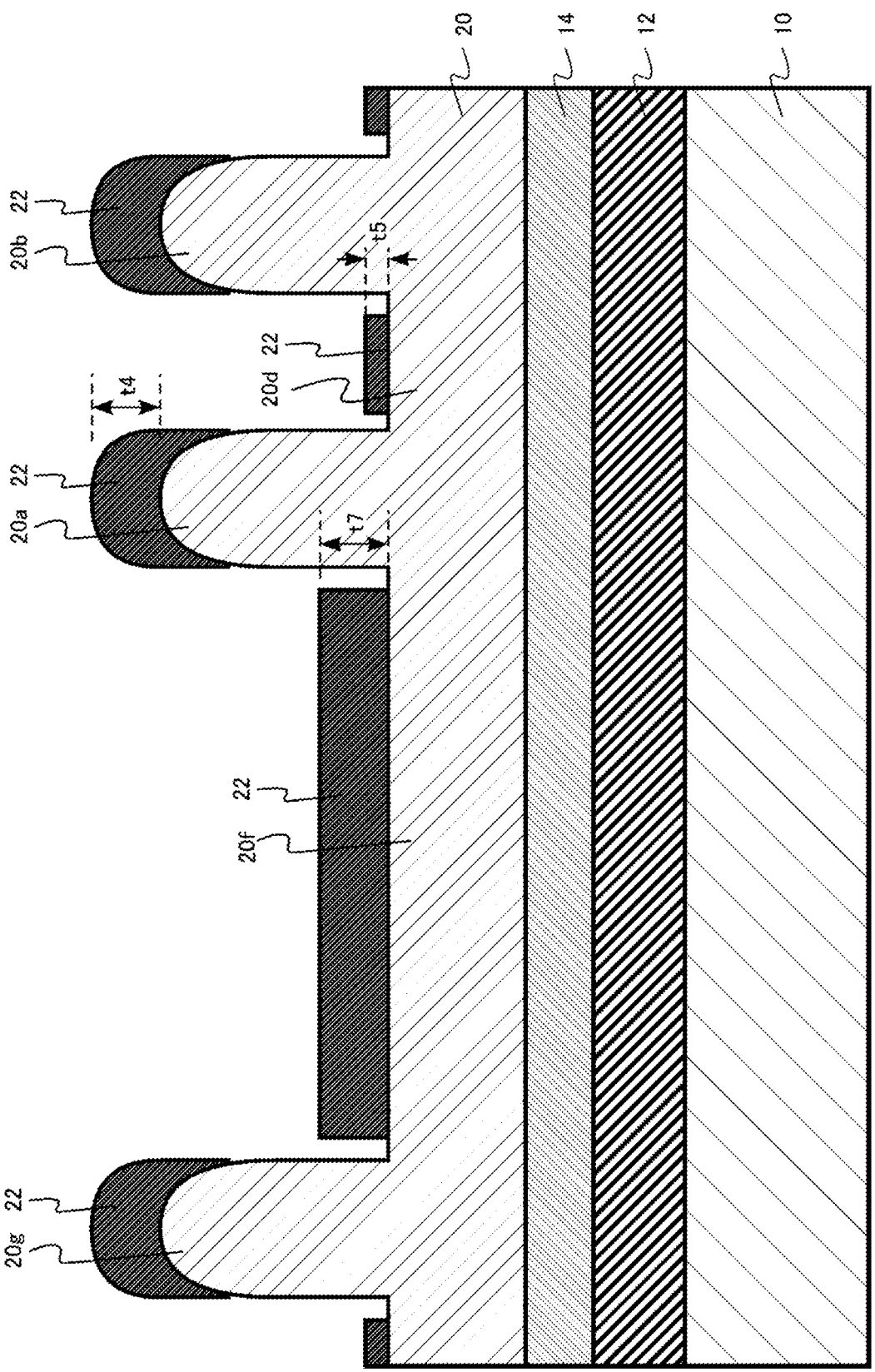

In the process chamber 101 of the reactive ion etching device 100 (shown in FIG. 6), a mask layer 22 containing silicon oxide is formed on a surface of the resist layer 20, as depicted in FIG. 15. The mask layer 22 uses, for example, silicon oxide as a main component. The mask layer 22 is formed on the projected region 20a, the projected region 20b, the projected region 20g, and the wide region 20f, and need not necessarily be formed on the recessed region 20d depending of selected processing conditions and the like.

A fourth thickness of the mask layer 22 on the projected region 20a (t4 in FIG. 15) and a seventh thickness of the mask layer 22 on the wide region 20f (t7 in FIG. 15) are both greater than a fifth thickness of the mask layer 22 on the recessed region 20d (t5 in FIG. 15). The fourth thickness t4 and the seventh thickness t7 are, for example, between five times and fifty times greater than the fifth thickness t5.

The fourth thickness t4 is in a range of, for example, 2 nm to 10 nm. The fifth thickness t5 is, greater than 0 nm but less than or equal to 2 nm. The seventh thickness t7 is in a range of, for example, 2 nm to 10 nm.

Figure 16:
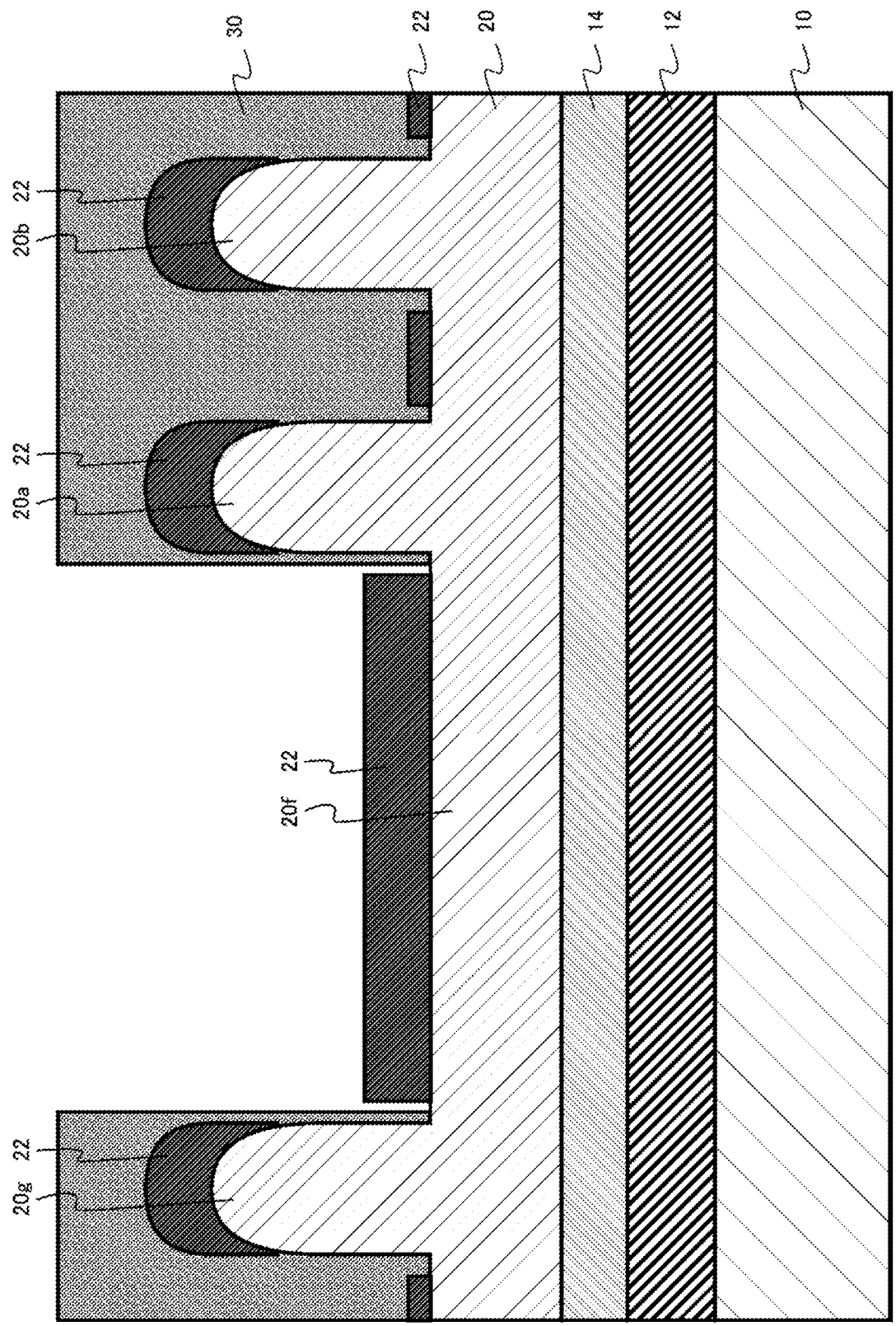

After the resist layer 20 and mask layer 22 are formed, a photoresist layer 30 having the open/uncovered region corresponding in position to the wide region 20f is formed, as depicted in FIG. 16. The photoresist layer 30 can be formed by known photolithographic methods.

Figure 17:
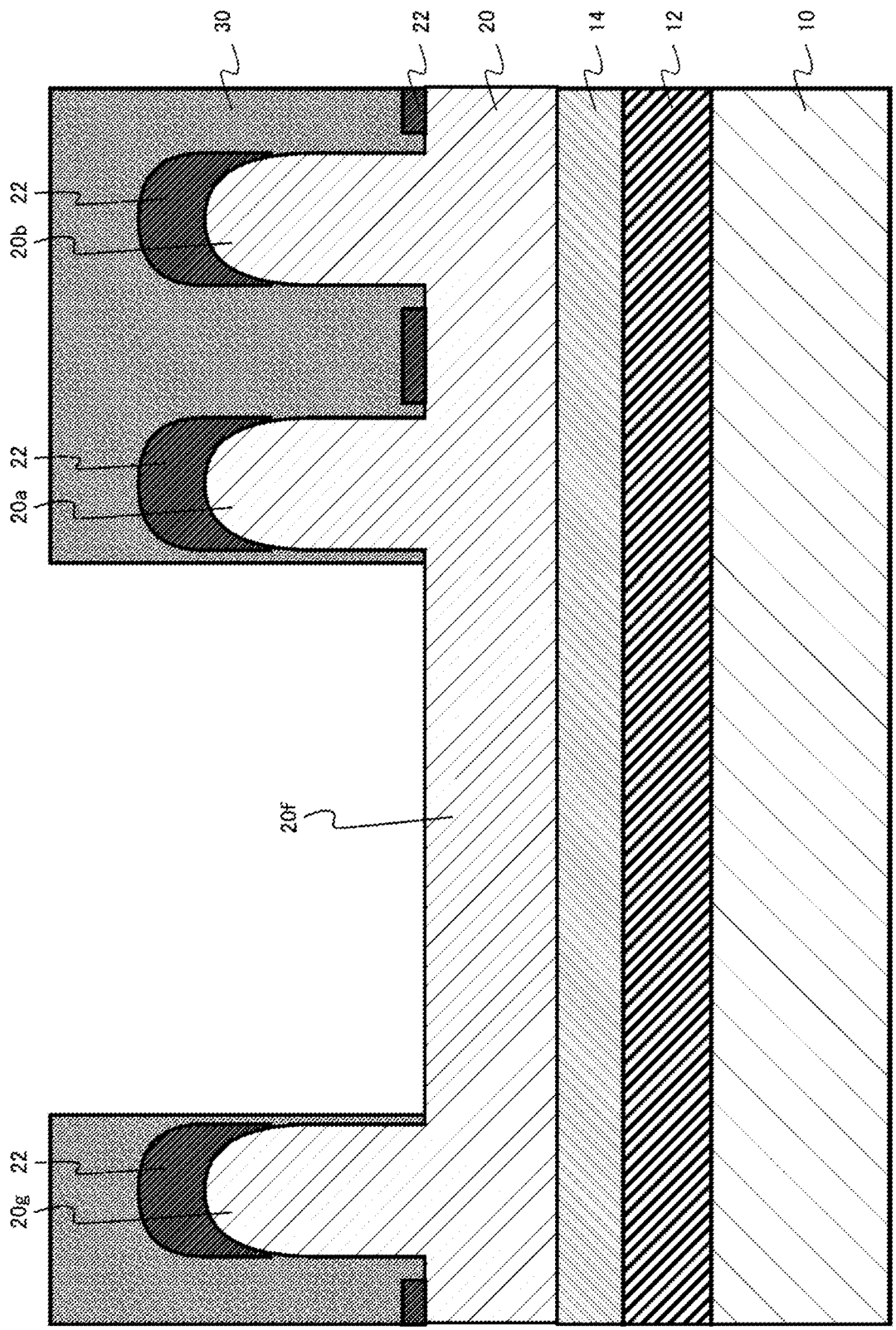

Next, the mask layer 22 on the wide region 20f is removed in a processing using the photoresist layer 30 as a mask, as depicted in FIG. 17. The mask layer 22 can be removed by, for example, known wet etching methods.

Figure 18:
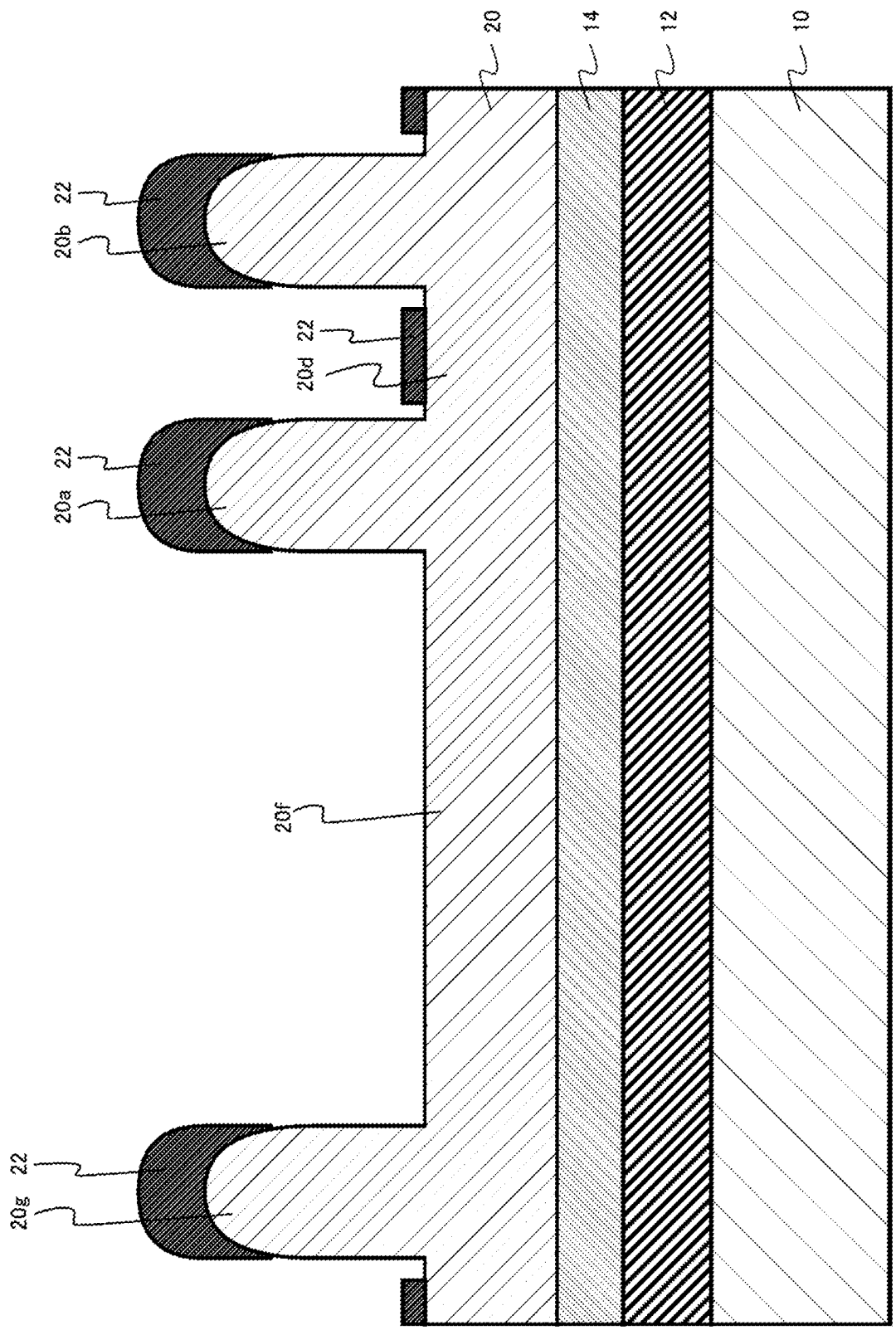

Next, the photoresist layer 30 is removed, as depicted in FIG. 18.

Figure 19:
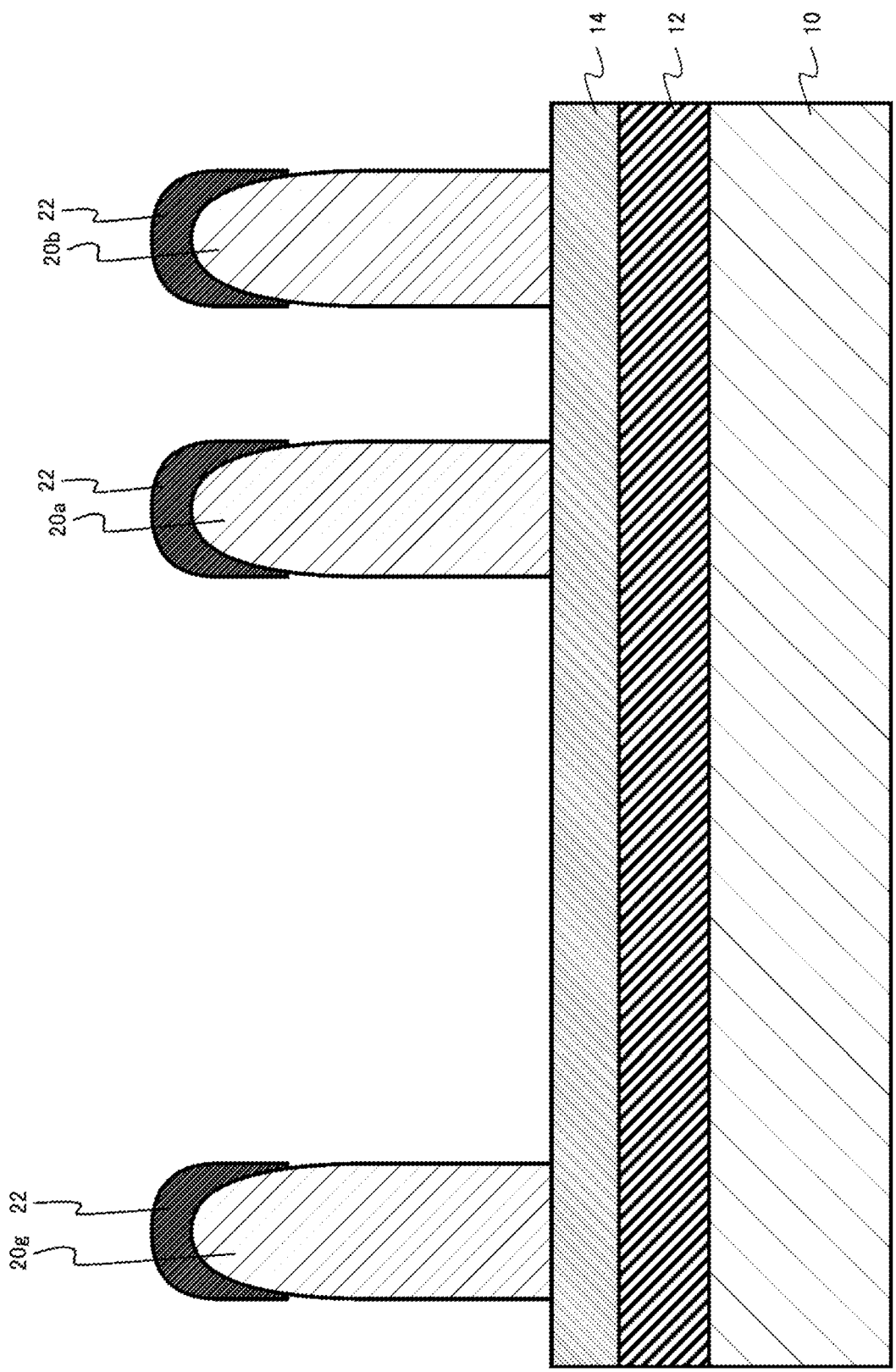

Next, the recessed region 20d and the wide region 20f of the resist layer 20 are then etched in the process chamber 101 of the reactive ion etching device 100 (FIG. 19). The recessed region 20d and the wide region 20f of the resist layer 20 are etched leaving the projected regions 20a, 20b, and 20g (or at least substantial portions thereof).

Figure 20:
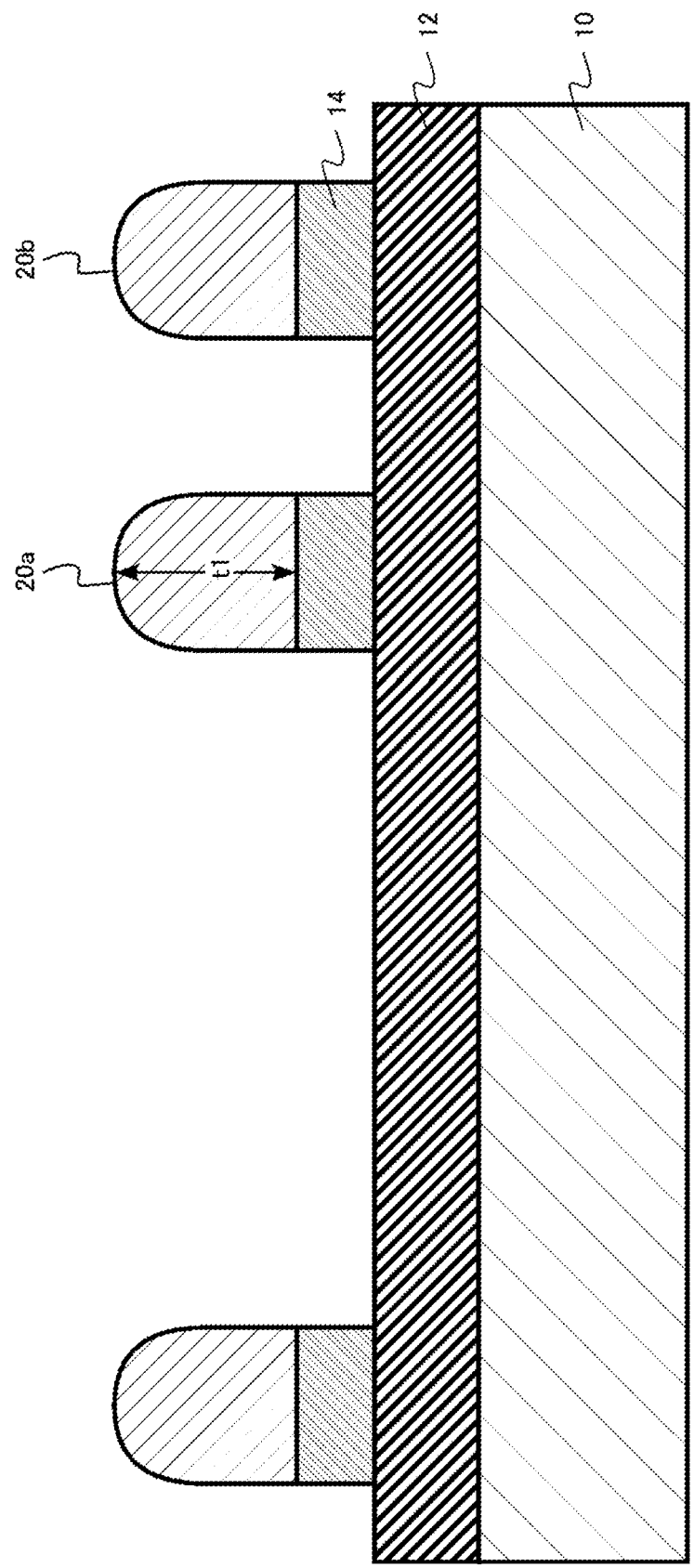

Next, the metal layer 14 is etched using the mask layer 22 and the resist layer 20 as a mask, as depicted in FIG. 20. The metal layer 14 is patterned by this etching. For example, the etching of the metal layer 14 is performed using a reactive ion etching device that is different from the reactive ion etching device 100.

In general, when the metal layer 14 is etched, the mask layer 22 on the projected regions 20a, 20b, and 20g will be completely removed by the etching process, such that the first thickness t1 of the projected region 20a may be somewhat reduced, for example.

Figure 21:
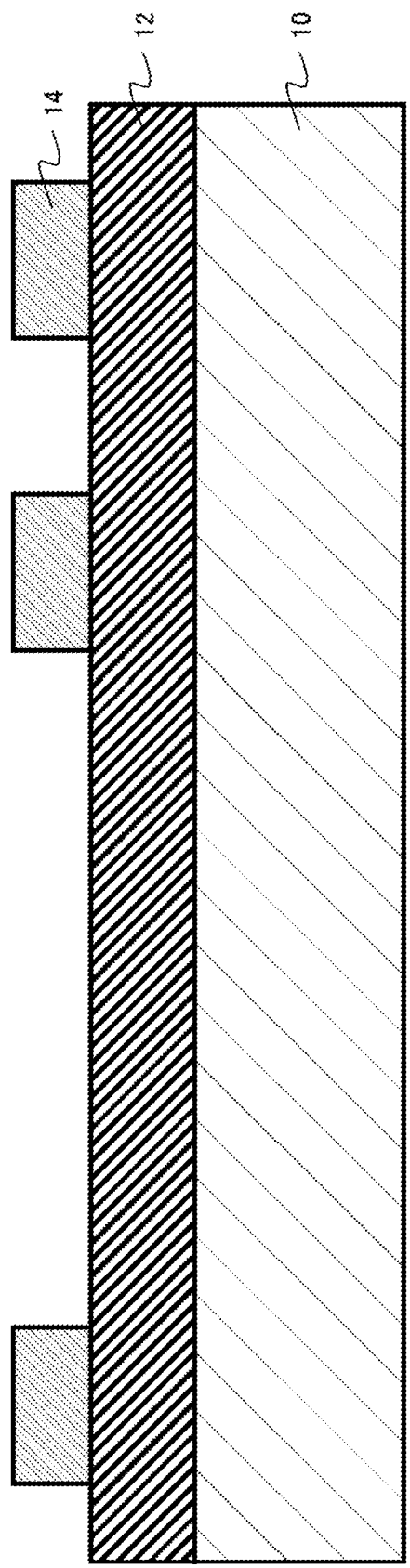

Next, any resist layer 20 remaining on the patterned metal layer 14 is removed, as depicted in FIG. 21.

Thus, it is possible to form a fine pattern including a pattern having a wide space therein, for example, a pattern with a mixed pattern density of sparse and dense features or the like.

The case in which the second layer (which is the layer to be processed) is a metal layer and the pattern is formed directly thereon is described as an example in the first and second embodiments. However, for example, it is possible to use an insulating layer as the second layer and have the pattern formed on the insulating layer and transferred thereto.

The case of forming the line and space pattern is described as an example in the first and second embodiments. However, the present disclosure is not limited thereto and is possible to apply the present disclosure to the case of forming contact holes or the like.

A case in which a pattern including a projected region and a recessed region was formed on the organic layer by using a nano-imprinting method was described as an example in the first and second embodiments. However, it is possible to also apply the teachings of the present disclosure to a case in which such a pattern is formed in the organic layer by using self-assembly of a block copolymer or the like.

In addition, the first and second embodiments are described in conjunction with the manufacturing of a semiconductor device, but the present disclosure is not limited to the manufacture of semiconductor device. For example, it is possible to also apply the present disclosure to the case of manufacturing many other products such as a high-density recording medium and a liquid crystal display device, or, in general, any product requiring fine patterning or the like.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A pattern forming method, comprising:
   forming an organic layer on a first layer, the organic layer having a first region of a first thickness and a first width, a second region of a second thickness and a second width, and a third region between the first region and the second region, the third region having a third width and a third thickness that is less than each of the first thickness and the second thickness;
   forming a second layer comprising silicon oxide on a surface of the organic layer in a process chamber of a reactive ion etching device; and
   etching the third region using the second layer as a mask in the process chamber.

2. The pattern forming method according to claim 1, wherein a value obtained by dividing the difference between the first thickness and the third thickness by the third width is equal to 1 or more.

3. The pattern forming method according to claim 1, wherein the first thickness is equal to the second thickness, and the first width is equal to the second width.

4. The pattern forming method according to claim 1, wherein a thickness of the second layer on the first region is a fourth thickness, and a thickness of the second layer on the third region is a fifth thickness that is less than the fourth thickness.

5. The pattern forming method according to claim 4, wherein the fifth thickness is greater than 0 nm but less than or equal to 2 nm.

6. The pattern forming method according claim 1, wherein the third width is less than or equal to 40 nm.

7. The pattern forming method according to claim 1, wherein a first pressure in the process chamber during the forming of the second layer is higher than a second pressure in the process chamber during the etching of the third region.

8. The pattern forming method according to claim 1, wherein the first layer is etched using the organic layer as a mask after the etching of the third region.

9. The pattern forming method according to claim 8, wherein the etching of the first layer occurs in a different process chamber from that used for the forming of the second layer and the etching of the third region.

10. The pattern forming method according to claim 1, wherein the organic layer includes a fourth region having a sixth thickness less than the first thickness and a fourth width greater than the third width, and the second layer on the fourth region is removed before the etching of the third region.

11. A method of manufacturing a semiconductor device, comprising:
    forming a first layer on a substrate;
    forming a patterned organic layer on the first layer, the patterned organic layer having a first region of a first thickness and a first width, a second region of a second thickness and a second width, and a third region between the first region and the second region, the third region having a third width and a third thickness that is less than each of the first thickness and the second thickness;
    forming a second layer comprising silicon oxide on a surface of the patterned organic layer in a process chamber of a reactive ion etching device; and
    etching the third region using the second layer as a mask in the process chamber.

12. The method of manufacturing a semiconductor device according to claim 11, wherein a value obtained by dividing the difference between the first thickness and the third thickness by the third width is equal to 1 or more.

13. The method of manufacturing a semiconductor device according to claim 11, wherein the first thickness is equal to the second thickness, and the first width is equal to the second width.

14. The method of manufacturing a semiconductor device according to claim 11, wherein a thickness of the second layer on the first region is a fourth thickness, and a thickness of the second layer on the third region is a fifth thickness that is less than the fourth thickness.

15. The method of manufacturing a semiconductor device according to claim 14, wherein the fifth thickness is greater than 0 nm but less than or equal to 2 nm.

16. The method of manufacturing a semiconductor device according to claim 11, wherein the third width is less than or equal to 40 nm.

17. The method of manufacturing a semiconductor device according to claim 11, wherein a first pressure in the process chamber during the forming of the second layer is higher than a second pressure in the process chamber during the etching of the third region.

18. The method of manufacturing a semiconductor device according to claim 11, wherein the first layer is etched using the patterned organic layer as a mask after the etching of the third region.

19. The pattern forming method according to claim 18, wherein the etching of the first layer occurs in a different process chamber from that used for the forming of the second layer and the etching of the third region.

20. The method of manufacturing a semiconductor device according to claim 11, wherein the patterned organic layer includes a fourth region having a sixth thickness less than the first thickness and a fourth width greater than the third width, and the second layer on the fourth region is removed before the etching of the third region.

* * * * *